(12) United States Patent
Kane et al.

(10) Patent No.: US 6,670,717 B2
(45) Date of Patent: Dec. 30, 2003

(54) STRUCTURE AND METHOD FOR CHARGE SENSITIVE ELECTRICAL DEVICES

(75) Inventors: Terence Kane, Wappingers Falls, NY (US); Lawrence S. Fischer, Poughkeepsie, NY (US); Steven B. Herschbein, Hopewell Junction, NY (US); Ying Hong, San Jose, CA (US); Michael P. Tenney, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/977,807

(22) Filed: Oct. 15, 2001

(65) Prior Publication Data

US 2003/0071361 A1 Apr. 17, 2003

(51) Int. Cl.[7] .................. H01L 23/48; H01L 23/52; H01L 29/40
(52) U.S. Cl. .................. 257/774; 257/48; 257/750; 257/754; 257/758; 257/775
(58) Field of Search .................. 257/48, 754, 750, 257/758, 774, 775

(56) References Cited

U.S. PATENT DOCUMENTS

| 4,624,864 A | * | 11/1986 | Hartmann ............ 438/642 |
| 4,687,940 A | | 8/1987 | Ward et al. |
| 4,925,755 A | | 5/1990 | Yamaguchi et al. |
| 5,104,684 A | | 4/1992 | Tao et al. |
| 5,182,231 A | * | 1/1993 | Hongo et al. ........... 438/598 |
| 5,215,824 A | * | 6/1993 | Munro, III et al. ...... 428/473.5 |
| 5,376,883 A | | 12/1994 | Kaito |
| 5,504,340 A | | 4/1996 | Mizumura et al. |
| 5,574,280 A | | 11/1996 | Fujii et al. |
| 5,821,160 A | * | 10/1998 | Rodriguez et al. ........ 438/601 |
| 5,861,328 A | * | 1/1999 | Tehrani et al. ............ 438/210 |
| 6,114,186 A | * | 9/2000 | Jeng et al. ................. 438/623 |
| 6,124,164 A | * | 9/2000 | Al-Shareef et al. ....... 438/240 |

(List continued on next page.)

FOREIGN PATENT DOCUMENTS

| JP | 62040723 A | 2/1987 |
| JP | 63178544 A | 7/1988 |
| JP | 2178930 A | 7/1990 |
| JP | 2180035 A | 7/1990 |
| JP | 4127526 A | 4/1992 |
| JP | 8139099 A | 5/1996 |

*Primary Examiner*—Michael Trinh
*Assistant Examiner*—Ida M. Soward
(74) *Attorney, Agent, or Firm*—Todd M. C. Li; McGinn & Gibb, PLLC.

(57) ABSTRACT

A method and structure for the electrical characterization of a semiconductor device comprising, first, forming a hole having a diameter less than 0.15 $\mu$m, wherein the hole is created using focused ion beam (FIB) etching, and through at least a protective cap layer formed over the device. The FIB etching occurs in an electron mode using a beam current less than 35 pA with an aperture size less than 50 $\mu$m, and at an acceleration voltage of about 50 kV. Second, the surface of the hole is coated with a metal, preferably using chemical vapor deposition (CVD) and preferably using a FIB device. Third, a metal pad is deposited, preferably by FIB CVD, over the hole. Fourth, the pad is probed to determine characteristics and/or detect defects of the electrical device. The present invention allows for electrical characterization without causing damage to the device or its features.

21 Claims, 5 Drawing Sheets

U.S. PATENT DOCUMENTS

| | | | |
|---|---|---|---|
| 6,140,672 A * | 10/2000 | Arita et al. .................. | 257/295 |
| 6,165,833 A * | 12/2000 | Parekh et al. ................ | 438/240 |
| 6,165,834 A * | 12/2000 | Agarwal et al. ............ | 438/240 |
| 6,171,925 B1 * | 1/2001 | Graettinger et al. ........ | 438/396 |
| 6,177,670 B1 | 1/2001 | Sugiyama | |
| 6,249,014 B1 * | 6/2001 | Bailey ........................ | 257/295 |
| 6,274,388 B1 * | 8/2001 | Aggarwal et al. ............. | 438/3 |
| 6,277,708 B1 * | 8/2001 | Bothra et al. ................ | 438/430 |
| 6,297,173 B1 * | 10/2001 | Tobin et al. ................. | 438/778 |
| 6,303,952 B1 * | 10/2001 | Aoki et al. .................. | 257/295 |
| 6,342,733 B1 * | 1/2002 | Hu et al. ..................... | 257/750 |
| 6,383,920 B1 * | 5/2002 | Wang et al. .................. | 438/639 |
| 6,444,564 B1 * | 9/2002 | Raeder ........................ | 438/618 |
| 6,448,622 B1 * | 9/2002 | Franke et al. ................ | 257/415 |
| 2001/0029070 A1 * | 10/2001 | Yamazaki et al. .......... | 438/149 |
| 2002/0000670 A1 * | 1/2002 | Yau et al. .................... | 257/759 |
| 2002/0020868 A1 * | 2/2002 | Yang et al. .................. | 257/303 |
| 2002/0020870 A1 * | 2/2002 | Ueno et al. .................. | 257/315 |
| 2002/0024141 A1 * | 2/2002 | Amishiro et al. ............ | 257/758 |
| 2002/0055246 A1 * | 5/2002 | Jiang et al. .................. | 438/597 |
| 2002/0055256 A1 * | 5/2002 | Jiang .......................... | 438/687 |

* cited by examiner

STRUCTURE AND METHOD FOR CHARGE SENSITIVE ELECTRICAL DEVICES

BACKGROUND OF THE INVENTION

1. Field of the Invention

The present invention generally relates to silicon on insulator technology microprocessor designs, and more particularly to a new structure and method for electrically characterizing submicron MOSFET devices and passive structures.

2. Description of the Related Art

In order to electrically characterize submicron MOSFET devices and passive structures on advanced technology sub 0.13 $\mu$m channel length devices incorporating thin gate oxide films (less than about 2 nm), low-k dielectric films (both spin on low-k dielectric films and PECVD low-k films) and silicon-on-insulator FEOL (front end of the line) technology, focused ion beam drilling may be used. The drilling occurs through low-k dielectric films, which typically have dielectric constants of less than about 3.3, examples of which are available commercially, and other dielectric films (i.e., PECVD silicon oxide, LPCVD silicon, HDP nitride, LPCVD nitride, TEOS, BPSG, PSG, polymide, and other conventional dielectric materials having dielectric constants roughly in the range of about 4 to 5) and requires focused ion beam (FIB) gas assisted etching (GAE) (using such gases as $XeF_2$, $Cl_2$, $Br_2$, TMCTS with Oxygen).

In the prior art, this GAE etch "drilling" of a hole is accomplished with FIB apertures 65 $\mu$m and larger using FIB beam currents greater than 100 pA (nominally) to react with a tungsten metal source heated above 52° C. for gas sublimation reaction. The incident 30 kV (and higher acceleration voltage) FIB electron beam with the gaseous tungsten (delivered with nozzles) produces tungsten ions that "coat" or deposit tungsten on the surfaces in the region of interest.

Typically, in this prior art, the electron beam currents associated with these aperture sizes are as follows:

| Aperture Size | Beam Currents (assuming 50 kV Accelerating Beam) |
|---|---|
| 60 $\mu$m | 91.8 pA |
| 75 $\mu$m | 209.2 pA |
| 100 $\mu$m | 569.0 pA |
| 150 $\mu$m | 2,071.0 pA |
| 200 $\mu$m | 4,761.0 pA |
| 250 $\mu$m | 8,658.0 pA |
| 300 $\mu$m | 3,679.0 pA |
| 350 $\mu$m | 19,704.0 pA |
| 400 $\mu$m | 26,596.0 pA |

Emerging technologies (sub 0.13 $\mu$m channel length devices, thin gate oxide films (less than about 2 nm), low-k dielectric porous films (both spin on low-k dielectric films and PECVD low-k films) and silicon-on-insulator) cannot be subjected to high FIB beam currents in electron or charge neutralizing modes.

In FIB electron beam modes with beam currents greater than 91.8 pA, undesirable rupturing of thin gate oxides results as well as charging/discharging of the MOSFET devices, especially with "floating body" effects in partially depleted SOI structures. Damage to passive structures, especially with low-k dielectric films occurs due to beam induced charging. In addition, with the FIB operation in a charge neutralized mode (i.e., "flood gun"), the resulting imaging resolution is degraded, and prevents the drilling operation with submicron (<0.18 $\mu$m) spacings and/or feature sizes to occur without shorting/leakage paths introduced from the gallium beam. The resolution imaging capability of the FIB in the charge neutralized mode is likewise reduced.

In addition, the deposited CVD tungsten or platinum reaction with apertures of 60 $\mu$m and greater produces an "overspray" or deposition in an area greater than the submicron hole feature itself producing additional shorting/leakage paths to adjacent device features/passive structures.

Silicon on Insulator (SOI) designed microprocessors offer first order benefits of lower power operation, reduced junction capacitance, and higher device densities; all of which combine in providing significant improvements in device performance and faster circuit level speeds. Integrating SOI technology with lower resistance (<2 $\mu\Omega$-cm) copper Back End of Line (BEOL) interconnections instead of aluminum-copper BEOL interconnection (>3 $\mu\Omega$-cm resistance) offers further enhancements in microprocessor performance.

Electrical measurements of the sub 0.25 $\mu$m sized NFET and PFET devices contained in the embedded cells of these SOI designs pose new demands in developing alternative techniques and methods for both electrical characterization and physical analysis.

MOSFET devices in prior art SOI designs do not tie the FET's body to the source implant but instead are allowed to "float" because of the insulating layer used in this technology. Conventional methods of scanning electron microscopy, transmission electron microscopy, or focused ion beam microscopy, where energetic (>30 kV) electron or ion beams are employed, can produce unwanted effects affecting electrical and physical analysis.

Newer electrical characterization techniques such as atomic force microscopy imaging of submicron device features and physical AFM electrical probe contact measurements may be necessary when characterizing junction areas above the SOI insulating layer.

Scanning capacitance microscopy is another technique successfully employed in pinpointing specific submicron device features in the embedded array cells. Specific sites less than 0.3 $\mu$m have been identified this way that correlate to anomalous electrically measured results. Subsequent transmission electron microscopy (TEM) accuracy is further enhanced by this pinpointing technique. This successful localization permits enhanced TEM analysis involving electron energy loss spectroscopy (EELS) to detect the presence of low atomic number elements.

The use of conventional FIB parameters to deposit chemical vapor deposited tungsten or platinum probe pads as an aid in assisting submicron device probing or circuit deletion/isolation of levels near the SOI insulating layer may induce unwanted charge build-up as well as gallium ion leakage inimical to SOI designs.

Similarly, changes in TEM sample preparation techniques must be adopted to avoid introducing induced artifacts and physical damage. In those instances where samples are thinned via FIB sectioning, the same concerns exist as described earlier (i.e., introduction of unwanted charge buildup and/or gallium induced leakage paths).

Specific features in CMOS latching circuits of SOI designs can now be pinpointed by using these modified electrical techniques, aided by the use of scanning capacitance microscopy and enhanced TEM physical analysis/sample preparation techniques.

To minimize the unwanted effects affecting electrical and physical analysis, modifications in the electrical characterization techniques as well as changes in FIB circuit analysis and sample preparation must be made to avoid the introduction of misleading electrical measurement results and artifacts in physical analysis results.

Generally, for SOI technology, and specifically, for example, for low-k dielectric-based technology, strained-silicon junction technology, and very thin (less than about 2 nm) gate dielectric technology, there is an absence of techniques for device characterization and pinpointing defects. Submicron devices require characterization for design verification, and current techniques such as FIB assisted probing will damage features. Thus, there is a need to characterize without damaging the device and features.

SUMMARY OF THE INVENTION

In view of the foregoing and other problems, disadvantages, and drawbacks of the conventional electrical characterization techniques, the present invention has been devised, and it is an object of the present invention to provide an improved structure and method to electrically characterize submicron features for active or passive devices for low current and low voltage characterization. It is another object of the present invention to pinpoint specific device features that are the source of anomalous electrical measurements. It is still another object of the present invention to provide the electrical characterization for charge sensitive electrical devices.

In order to attain the objects suggested above, there is provided, according to one aspect of the invention a method and structure for the electrical characterization of a charge sensitive electrical device comprising, first, drilling a hole in the electrical device, wherein the hole is created using focused ion beam etching, and wherein the hole further comprises a surface. The focused ion beam etching occurs in an electron mode using a beam current less than 35 pA with an aperture size less than 50 μm. Second, the surface of the hole is coated with a metal such as tungsten or platinum using chemical vapor deposition (CVD). Third, a metal pad (such as tungsten or platinum) deposited by CVD is formed over the hole. The CVD deposited metal pad is a film, which acts as a probe contact. Fourth, the electrical device is probed to detect defects therein. Furthermore, the hole allows for the electrical characterization and for detecting defects in an electrical device without causing damage to the device or its features, thereby, the present invention is advantageous over the prior art.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

As mentioned above, there is a need for an improved structure and method to electrically characterize submicron features for active or passive devices for low current and low voltage characterization. According to the present invention, non-standard FIB (Focused Ion Beam) operating parameters are disclosed. Specifically, non-standard beam currents employed with very small aperture sizes as well as non-standard apertures of 25 μm and smaller are employed with a FIB microscope operating at about 50 kV accelerating beam voltages in an electron mode. The method in accordance with the present invention images and drills holes 0.15 μm in diameter (and smaller) with beam currents far less than previously disclosed, and coats the inside hole diameter surface, without filling the hole, with enough conducting metal (such as tungsten or platinum) for electrical continuity.

The following chart shows the non-standard FIB operating parameters (using an acceleration voltage of about 50 kV), which are used in the present invention:

| Aperture | Indicated Beam Current |
| --- | --- |
| 15 μm (non standard) | 1.0 pA* |
| 20 μm (non standard) | 1.4 pA* |
| 25 μm (non standard) | 2.0 pA* |
| 37.5 μm (non standard) | 10.0 pA* |
| 50 μm | 35.0 pA |

The FIB instrument current measurements denoted by an asterisk (*) are shown by measurements as an unreliable and inaccurate indication of the actual beam current. The actual usefulness and operability of such indicated low (but not actual) beam currents for the purposes of ionizing the inputted sublimated source gas of a metal such as tungsten or platinum into ions for subsequent CVD deposition and electrical interconnections has been verified by electrical probe measurements conducted by both conventional tungsten wire probe tips as well as by AFM/SPM probe tip measurements. Moreover, the electrical continuity may be verified, and furthermore, can measure actual device characteristics such as FET subthreshold $V_T$ characteristics, $I_{off}$, $I_{on}$, $V_{Tlin}$, among others. Verified electrical measurements are obtained with apertures of 37.5 μm, 25 μm, 20 μm, and 15 μm.

Furthermore, the present invention allows that at such low beam currents, while operating in the Electron Mode (highest resolution mode possible), no damage occurs to the thin gate oxides (thickness less than about 2 nm), nor does charge up occur of the low-k dielectric films, nor does charge buildup/discharge occur on partially depleted SOI designs at these low incident FIB beam currents using these non-standard apertures.

Figure 5:
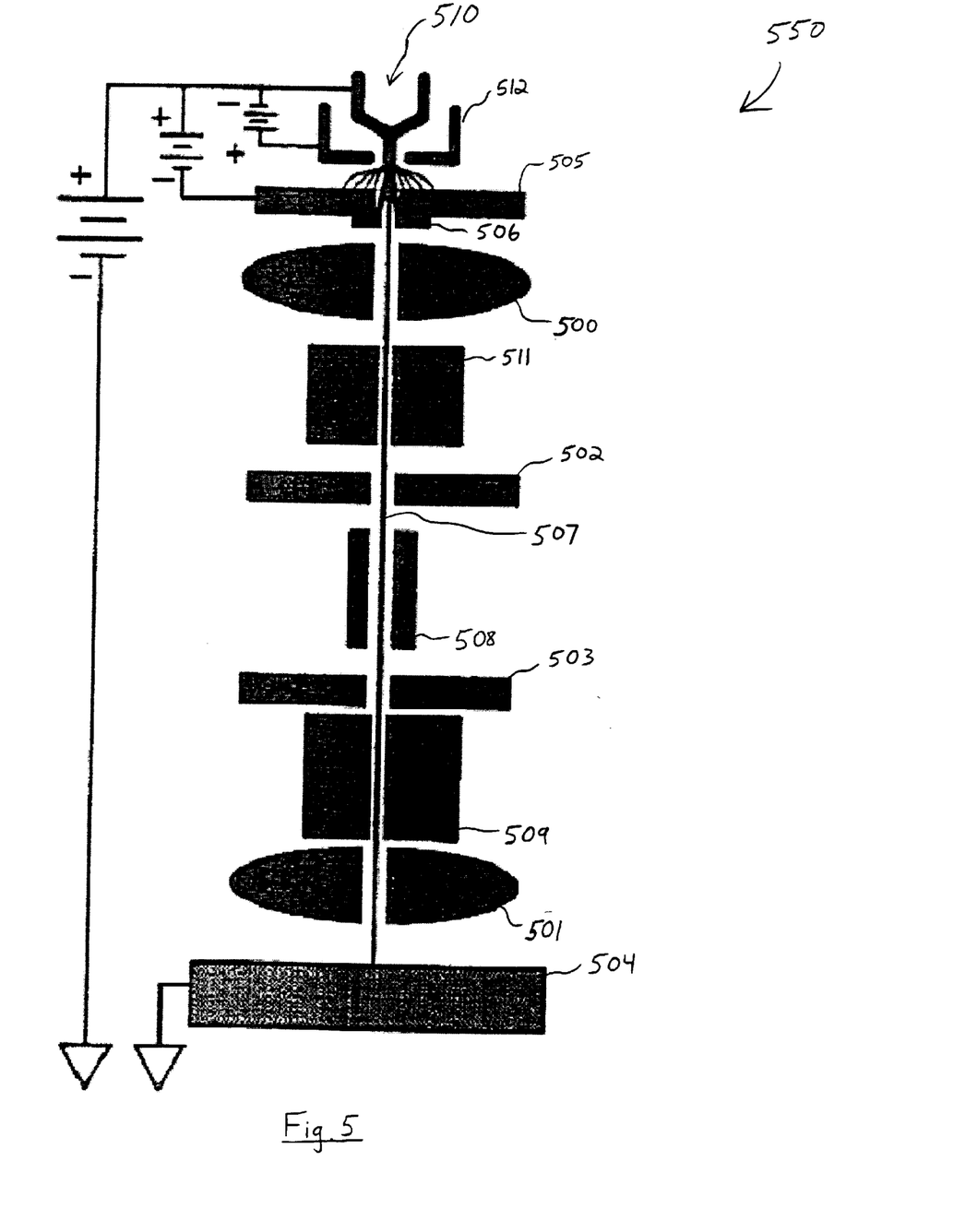
FIG. 5 is a schematic diagram of a focused ion beam tool.

A schematic drawing of a focused ion beam tool 550, used in conjunction with the present invention, is provided in FIG. 5. The tool comprises a plurality of electrostatic lenses 500, 501, and the beam is focused by a combination of apertures 502, 503, a stigmator 511, and a suppressor 512. Aperture 503 performs both as a focusing aperture as well as a blanking aperture to block the beam (not shown) entirely from hitting the sample (not shown). They are used when the beam is still on, but not when samples are being rotated on a stage 504 for the next analysis. Deflectors 508, 509 are also included for further focusing of the beam. The ion source 510 is a gallium metal which is heated to above 35° C. and sublimates directly into a gas. Using an extractor 505 with a spray aperture 506, the gallium dissociates into an ion beam (not shown) which is then accelerated down the column 507 to strike a target or sample (not shown) loaded on the stage 504.

The collimated beam (using both the apertures 502, 503 as well as the electrostatic focusing lenses) is a gallium+ion beam that is incident on a sample loaded on the stage 504. Small needle nozzles (not shown) at the stage level "spray" the tungsten carbonyl gas onto the sample where they are adsorbed (i.e., stick to the surface of the sample). The gas does not diffuse into the surface of the sample. Moreover, the incident gallium+ion beam strikes the same surface. The accelerated beam of gallium ions create phonon vibrations with their high accelerating beam potential (up to 50 kV) and cause chemical bond breakup of the tungsten carbonyl gas adsorbed on the surface of the sample. Tungsten ions are generated from this plasma chemical dissociation, also absorbing the kinetic energy of the incident gallium ion beam. Given the bias of these positively charged tungsten ions, a CVD (chemical vapor deposition) process is initiated and the tungsten ions coat surfaces within the plasma region defined by the ion beam.

For example, a FIB tool may "drill" a 0.125 mm hole in the electron mode using a low beam current (35–45 pA) with a 50 $\mu$m sized aperture on an SOI sample. The next step would be to deposit the tungsten or "coat" the inside of the hole. This is an example of discrete FET device characterization where an individual FET device within a six transistor SRAM cell is electrically characterized.

Next, the sample is electrically probed. Here, probe tips on a probe station and parametric analyzer contacts each pad deposited by the FIB and the characteristics of the SRAM cell are then measured. For example, with a discrete FET device, the electrically measured properties can be generated directly. If the measured electrical properties vary from the modeled or predicted properties, additional electrical characterization is performed and that information is relayed back to the designer to refine the device model as well as change the layout size (to change the size of a device if the measured properties do not match the required performance) and/or change the actual ion implant doses that form the source/drain of the device as well as other implant process steps.

The actual electrically measured device properties can result in a design change to the device or circuit in question and/or a modification in the process which the device is fabricated. For example, the size of the drilled region can be changed. Moreover, the ion implantation dose defining the source/drain of the FET can be better tailored than through the use of mathematical modeling predictions.

The uniqueness and novelty of the present invention stems, in part, from the non-standard operating parameters, as well as the use of the beam currents for the coating of tungsten for electrical interconnections that permit electrical characterization of both active (MOSFET) and passive (i.e., via chains, serpentine/comb) test structures on technologies involving such low-k dielectric films, thin gate oxides, and silicon-on-insulator FEOL (front end of the line) processing, as well as strained field SiGe technologies.

The present invention benefits emerging sub 100 nm node ULSI structures with sub 0.13 $\mu$m gate lengths employing partially depleted silicon-on-insulator FEOL structures, SiGe, strained-silicon shallow implant junctions, SEG (selected epitaxial growth) raised junctions, low-k dielectric ILD films, sub 1 nm gate oxides/high-k gate dielectrics, among other technical features. As mentioned, the increased sensitivity to charge induced damage posed by these technical characteristics represents significant challenges to submicron electrical characterization. Furthermore, techniques for FIB deposited metal (such as tungsten or platinum) pads for submicron feature electrical probing/characterization has demanded further refinements to avoid charge damage for such structures. Conventional charge neutralization or a "flood gun" operation during FIB metal (such as tungsten or platinum) deposition and FIB Gas Assisted Etching (GAE) with small 50 $\mu$m diameter apertures employing minimal 35 pA beam currents are sufficient for existing technologies but are wholly inadequate for emerging technologies.

Prior art minimum FIB aperture diameters for sufficient FIB CVD deposition of tungsten for pad formation has, thus far, precluded an investigation into experiments with smaller aperture sizes with corresponding lower beam currents.

As a result, charge induced artifacts encountered with conventional FIB assisted metal (such as tungsten or platinum) pad deposition has resulted in the present invention, which involves smaller apertures, lower FIB beam currents followed by electrical probe verification measurements.

In accordance with the present invention, employing aperture sizes as small as 15 $\mu$m diameter and an indicated 1.4 pA beam current and sufficient metal (such as tungsten or platinum) pad deposition is verified by subsequent electrical probing to be effective for device characterization. Benefits of smaller aperture size/lower beam current experiments corresponds to a lower risk of charge build up to SOI samples with sub 0.13 $\mu$m gate length. In addition, lower beam currents and smaller aperture experiments results in a lower degree of tungsten "overspray" (with lessened requirements for $XeF_2$ cleanup for tungsten metal deposition), reduced FIB dwell time during this "overspray" cleanup procedure, which further reduces charge build up on low-k films and lowered risk of gate oxide damage, as well as the added benefits of FIB operation in the Secondary Electron Mode without resorting to the Charge Neutralized or the "flood gun" mode.

This last benefit is quite significant, wherein the optimum resolution offered by operation in the Secondary Electron Mode (as compared to the Charge Neutralized Mode) could not even be considered an option when employing larger apertures and higher beam currents. The higher resolution offered by the Secondary Electron Mode combined with lower beam currents will enable imaging of sub 100 nm node ULSI structures in the FIB during CVD metal (for example tungsten or platinum) pad deposition for electrical characterization.

Previously labeled "impractical" apertures for tungsten or platinum CVD pad deposition, which are achieved by the present invention are as follows:

| Aperture | Indicated Beam Current |
|---|---|
| 15 $\mu$m | 1.4 pA |
| 25 $\mu$m | 4.0 pA |
| 37.5 $\mu$m | 14.1 pA |
| 50 $\mu$m | 35 pA |

Generally accepted apertures (including apertures larger than 100 $\mu$m), as indicated in the prior art, for tungsten CVD pad deposition illustrate the following results:

| Aperture | Beam Current |
|---|---|
| 60 $\mu$m | 91.8 pA |
| 75 $\mu$m | 209.2 pA |
| 100 $\mu$m | 569.0 pA |

With the present invention, lower beam currents with smaller aperture sizes permit lower charge damage risk in emerging technologies and still provide sufficient CVD deposited tungsten or platinum for electrical characterization. Operation in FIB secondary electron mode now expands the opportunity to resolve smaller features in the FIB during the imaging/FIB tungsten (or platinum) deposition of pads. This is especially useful for such shrinking wiring levels (or layers) such as Mc level (tungsten wiring), Pc level (boron doped polysilicon), and M1 through Mx metallization levels (copper wiring) associated with emerging ULSI technologies with a lower risk of charge induced damage; all during operation in Secondary Electron Mode. It is equally important for interconnection levels such as the Ca level layer (the first dielectric layer formed over the devices of interest) and for subsequent back end of line layers (or levels).

Figure 1:
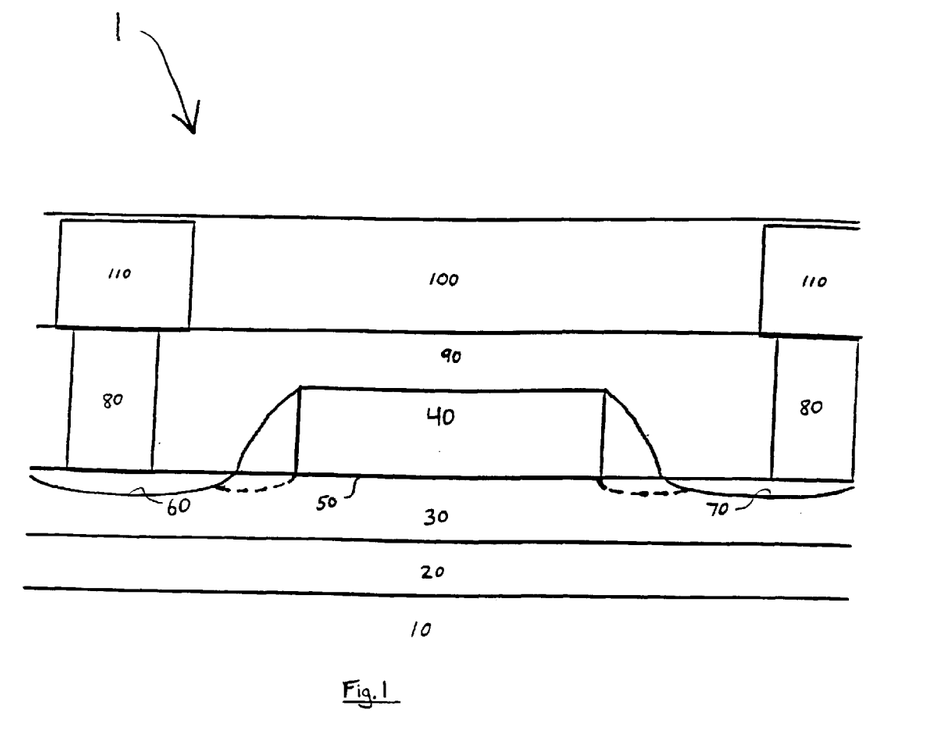
FIG. 1 is a schematic diagram of a partially completed electrical device according to the present invention.

Referring now to the drawings, and more particularly to FIG. 1, there are shown preferred embodiments of the method and structures according to the present invention. In FIG. 1, an electrical device embodied as a semiconductor composite 1 is illustrated comprising a silicon substrate base 10. Disposed above the silicon substrate base 10 is a buried oxide layer 20, and disposed above the buried oxide layer 20 is a single crystal silicon region 30. Above the single crystal silicon region 30, there is shown a boron phosphorus silicon glass dielectric insulator 90 with a plurality of Mc level wiring elements 80 disposed therein. Moreover, a doped polysilicon region 40 is further disposed in the boron phosphorus silicon glass dielectric insulator 90. A thin gate oxide 50, preferably less than 3 nm, is disposed in a portion of the barrier between the doped polysilicon region 40 and the single crystal silicon region 30. A pair of source 60 and drain 70 junction implants extend from the doped polysilicon region 40 into the single crystal silicon region 30. A Ca level dielectric insulator 100 (which may be a material such as TEOS, BPSG, low-k dielectric materials, or the like) is disposed above the boron phosphorus silicon glass dielectric insulator 90. The Ca level dielectric insulator 100 further comprises a plurality of Ca level via interconnects 110, which are disposed above the region defined by the Mc level wiring elements 80.

Figure 2:
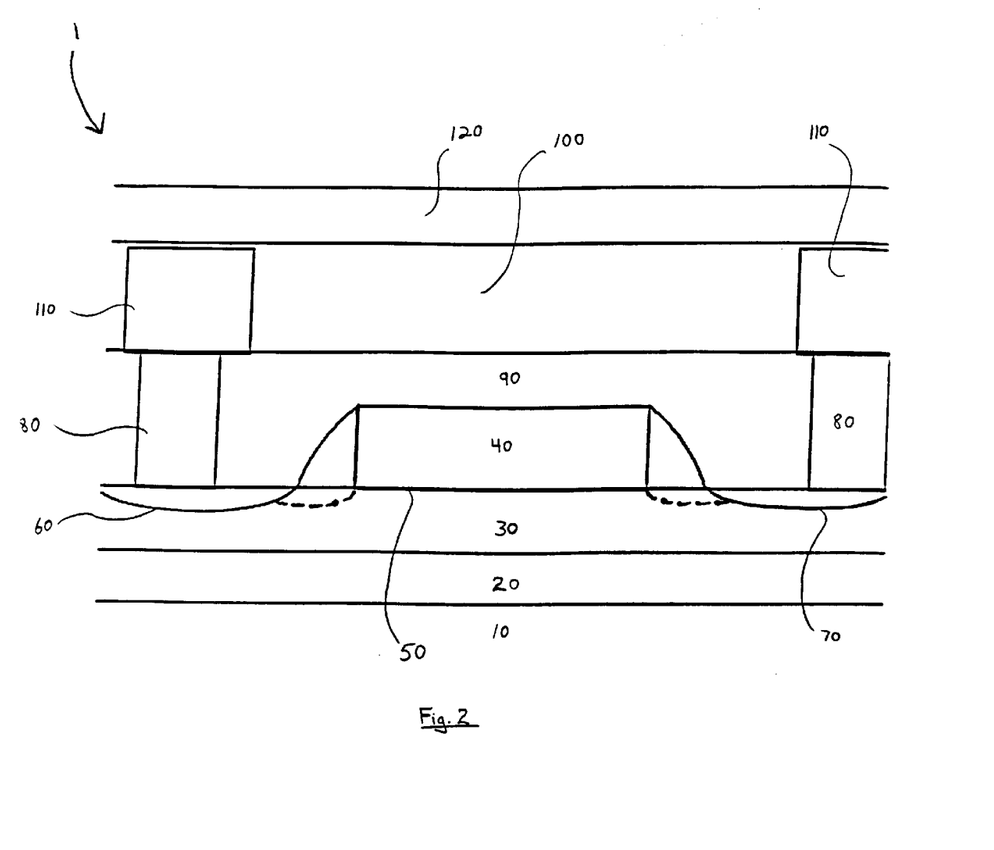
FIG. 2 is a schematic diagram of a partially completed electrical device according to the present invention.
Figure 3:
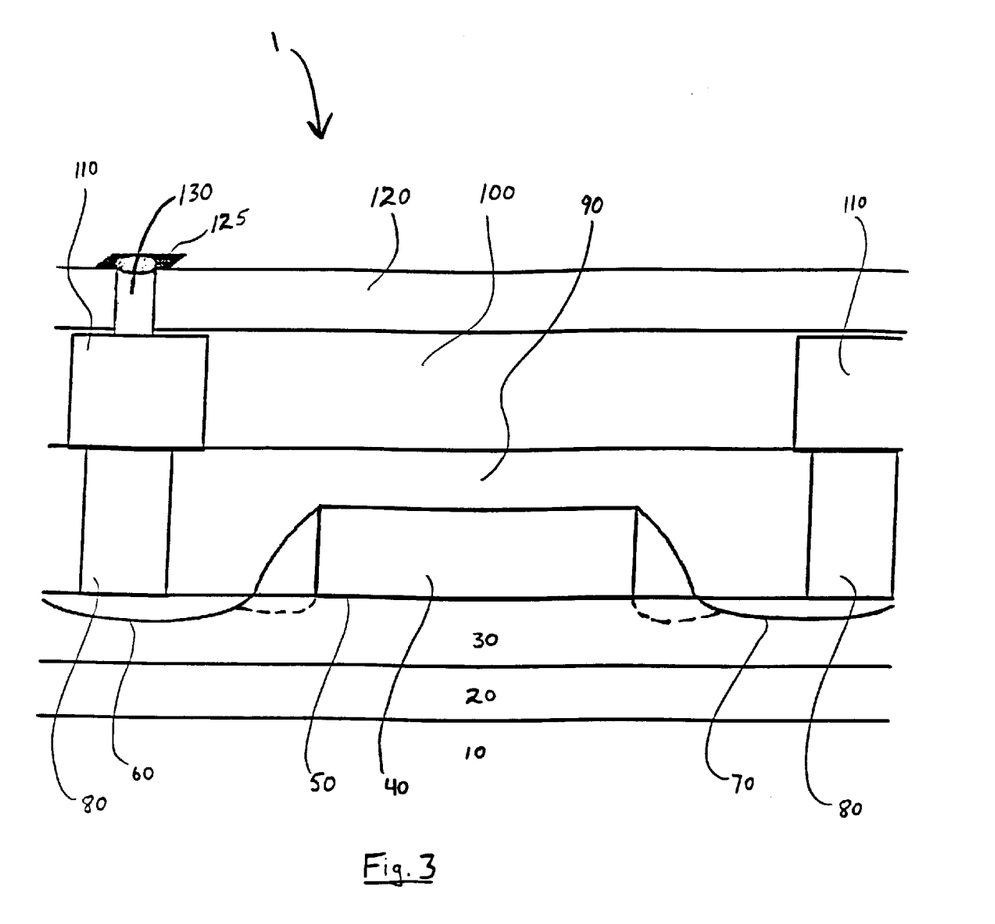
FIG. 3 is a schematic diagram of an electrical device according to the present invention.
Figure 4:
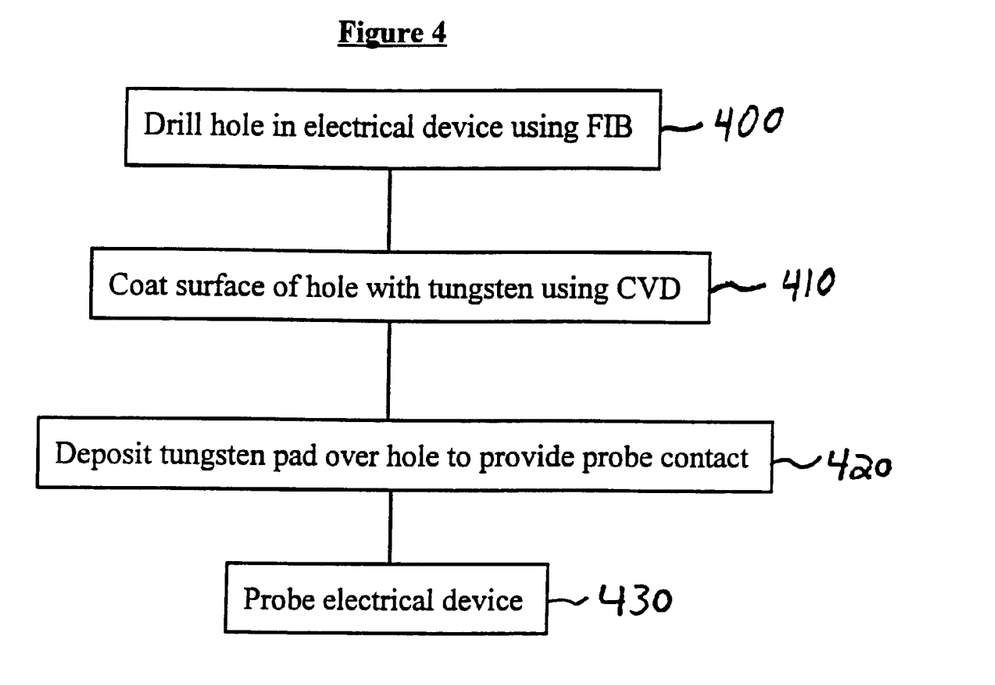
FIG. 4 is a flow diagram illustrating a preferred method of the invention.

FIG. 2 illustrates the semiconductor composite 1 of FIG. 1, and additionally illustrates a high-k (i.e. typically having a dielectric constant of 12 or greater) dielectric film 120, which acts as a protective cap disposed above the Ca level dielectric insulator 100 (which may be composed of TEOS, BPSG, a low-k dielectric material, or the like). The high-k dielectric layer 120 is preferably deposited by CVD, but could be deposited by any conventional method such as RF sputtering. FIG. 3 illustrates the semiconductor composite 1 further comprising a hole 130 drilled using a FIB to expose a conductive feature interconnected to the device of interest. The hold 130 includes a conductive film 125 (e.g. tungsten or platinum, or any CVD deposited metallic film) deposited thereon. Finally, FIG. 4 details the method to electrically characterize charge sensitive electrical devices without causing damage to the devices or their features. First, a hole 130 is drilled 400 in a semiconductor composite 1 using FIB, so that an underlying conductive interconnect is exposed at the bottom of the hole. Using the indicated beam current ranges, the hole 130 is drilled to a small aperture wherein the focused ion beam etching occurs in an electron mode using an indicated beam current less than 35 pA with an aperture size less than 50 μm:

| Aperture | Indicated Beam Current |
|---|---|
| 15 μm | 1.0–1.5 pA |
| 25 μm | 2.0–3.0 pA |
| 37.5 μm | 11.0–17.0 pA |

Again, the efficacy of these parameters is verified by electrically probing the FIB deposited CVD film of metal, such as tungsten or platinum, and determining that electrical continuity exists therein. Second, the surface of the hole 130 is coated 410 with a film of metal (such as tungsten or platinum) using CVD, which is preferably performed by a focused ion beam (FIB) device. Third, a metal pad 125 is deposited 420 over the hole 130 to provide a probe contact. The metal pad may be any CVD deposited metal, such as tungsten or platinum, and is preferably performed using a FIB. Fourth, the electrical device 1 is probed 430 by having a probe touch the probe contact 125. The CVD deposition, preferably using a FIB, begins by "coating" the inside diameter of hole 130. The advantages of coating (typically 5–15 angstroms thin) means less FIB dwell time and less exposure to the 50 kV accelerating voltage of the FIB beam. The minimization of exposure of SOI (silicon on insulator devices) to charge buildup means that the effects of the floating body will be minimized and the risk of degrading or rupturing the thin gate oxides (less than 20 angstroms or 2 nm) associated with MOSFET devices. In addition, the liquid gallium beam source of the FIB can result in gallium implantation into low-k dielectric films.

The present invention discloses non-standard FIB (Focused Ion Beam) operating parameters. More particularly, non-standard beam currents employed with very small aperture sizes as well as non-standard apertures of 25 μm and smaller are employed with a FIB microscope operating at about 50 kV accelerating beam voltages in an electron mode. According to the present invention, a hole 0.15 μm in diameter (and smaller) is imaged and drilled with beam currents far less than previously disclosed, and coats the inside hole diameter surface, without filling the hole, with enough conducting metal (such as tungsten or platinum, or any CVD deposited metal) for electrical continuity. Most importantly, the present invention accomplishes the electrical characterization of electrical devices without causing damage to the devices or their inherent features.

The differences in the structure of the present invention compared with prior art devices are several. First, the present invention comprises a high-k deposited cap layer 120 (such as TEOS, titanium isopropoxide, DES, silicon nitride, etc.) on top of the Ca level 100 for characterizing MOSFET or active devices. In passive devices (for example, via chains, serpentine chains, etc), the same cap layer may be deposited at different levels dependent on the via chain itself. This cap layer 120 protects an underlying dielectric layer 100, in particular, a low-k dielectric layer, from gallium implantation or other FIB interactions which would result in electrical leakage paths and shorting that would prevent electrical characterization.

The benefits of the present invention are numerous. For example, the present invention allows for the electrical characterization of MOSFET devices as well as passive devices (such as via chains, serpentine comb structures, etc.) following reliability stress. Additionally, the present invention provides actual device performance characteristics (such as SRAM cell characterization, eDRAM characteristics, logic circuit structures, etc.) to aid design engineers for debugging and design verification. Moreover, the present invention performs actual device measurements (i.e., FET subthreshold $V_T$ characteristics, $I_{off}$, $I_{on}$, $V_{Tlin}$, among others) that are essential for physical device build as contrasted with employing modeled device characteristics or predicted device performance parameters, which are based on device assumptions that may be incorrect or not an accurate prediction of actual device behavior. The advantages of basing device performance on actual electrical measurements avoids errors or differences between model assumptions and modeled device performance by using actual device operating characteristics. The present invention for the characterization of actual device parameters also benefit the reliability analysis of devices; whereby actual device reliability detects modes as compared to modeling predictions. The benefits of characterization of devices on actual physical methods enhance hardware performance and yield improvement ramp rates.

The advantages of coating the hole as opposed to filling it are numerous. For instance, by merely coating the hole, electrical continuity can still be accomplished. Moreover, coating minimizes the time the beam interacts with the device, which minimizes the charge buildup. This, in turn, minimizes the potential for the charge discharge, which significantly reduces the chance that the gate oxide is damaged.

While the invention has been described in terms of preferred embodiments, those skilled in the art will recognize that the invention can be practiced with modification within the spirit and scope of the appended claims.

What is claimed is:

1. A semiconductor structure for electrical characterization comprising:

a first dielectric layer formed over a semiconductor device, including a conductive feature electrically connected to said semiconductor device;

an uppermost dielectric cap layer overlying said first dielectric layer;

a hole extending through at least said uppermost dielectric cap layer, said hole having an inner diameter surface and a bottom surface comprising an exposed portion of said conductive feature; and a conductive coating covering said inner diameter surface of said hole, wherein said conductive coating does not fill said hole, so that pinpoint electrical characterization of said semiconductor device may be obtained through said conductive coating without filling the hole with additional conductive material.

2. The semiconductor structure of claim 1, wherein said hole has a diameter less than 0.15 $\mu$m.

3. The semiconductor structure of claim 1, wherein said conductive coating has a thickness in the range of 5–15 angstroms.

4. The semiconductor structure of claim 1, wherein said uppermost dielectric cap layer comprises a high-k dielectric material.

5. The semiconductor structure of claim 1, wherein said first dielectric layer comprises a low-k dielectric material.

6. The semiconductor structure of claim 1, wherein said uppermost dielectric cap layer has an upper surface, and further comprising a conductive pad on said upper surface of said uppermost dielectric cap layer, wherein said conductive pad is in electrical contact with said conductive coating.

7. A semiconductor structure for electrical characterization comprising:

a first dielectric layer formed over a semiconductor device, including a conductive feature electrically connected to said semiconductor device;

an uppermost dielectric cap layer overlying said first dielectric layer;

a hole extending through at least said uppermost dielectric cap layer, said hole having an inner diameter surface and a bottom surface comprising an exposed portion of said conductive feature; and a conductive coating covering said inner diameter surface of said hole, wherein said conductive coating does not fill said hole, said said conductive coating is deposited by a focused ion beam (FIB), so that pinpoint electrical characterization of said semiconductor device may be obtained through said conductive coating without filling the hole with additional conductive material.

8. The semiconductor structure of claim 7, wherein said hole has a diameter less than 0.15 $\mu$m.

9. The semiconductor structure of claim 7, wherein said conductive coating has a thickness in the range of 5–15 angstroms.

10. The semiconductor structure of claim 7, wherein said uppermost dielectric cap layer comprises a high-k dielectric material.

11. The semiconductor structure of claim 7, wherein said first dielectric layer comprises a low-k dielectric material.

12. The semiconductor structure of claim 7, wherein said semiconductor device is a silcon on insulator (SOI) device.

13. The semiconductor structure of claim 7, wherein said semiconductor device comprises a gate oxide having a thickness less than about 3 nm.

14. A semiconductor structure for electrical characterization comprising:

a first dielectric layer formed over a semiconductor device comprising a gate oxide having a thickness less than about 3 nm, including a conductive feature electrically connected to said semiconductor device;

an uppermost dielectric cap layer overlying said first dielectric layer;

a hole extending through at least said uppermost dielectric cap layer, said hole having an inner diameter surface and a bottom surface comprising an exposed portion of said conductive feature; and a conductive coating covering said inner diameter surface of said hole, wherein said conductive coating does not fill said hole, so that pinpoint electrical characterization of said semiconductor device may be obtained through said conductive coating.

15. The semiconductor structure of claim 14, wherein said hole has a diameter less than 0.15 $\mu$m.

16. The semiconductor structure of claim 14, wherein said conductive coating has a thickness in the range of 5–15 angstroms.

17. The semiconductor structure of claim 14, wherein said uppermost dielectric cap layer comprises a high-k dielectric material.

18. The semiconductor structure of claim 14, wherein said first dielectric layer comprises a low-k dielectric material.

19. The semiconductor structure of claim 14, wherein said semiconductor device is a silcon on insulator (SOI) device.

20. The semiconductor structure of claim 1, wherein said semiconductor device is a silcon on insulator (SOI) device.

21. The semiconductor structure of claim 1, wherein said semiconductor device comprises a gate oxide having a thickness less than about 3 nm.

* * * * *